(12) United States Patent
Iisaka et al.

(10) Patent No.: US 11,006,561 B2
(45) Date of Patent: May 11, 2021

(54) COMPONENT MOUNTER

(71) Applicant: FUJI CORPORATION, Chiryu (JP)

(72) Inventors: Jun Iisaka, Nisshin (JP); Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 260 days.

(21) Appl. No.: 16/314,801

(22) PCT Filed: Jul. 13, 2016

(86) PCT No.: PCT/JP2016/070676
§ 371 (c)(1),
(2) Date: Jan. 2, 2019

(87) PCT Pub. No.: WO2018/011907
PCT Pub. Date: Jan. 18, 2018

(65) Prior Publication Data
US 2019/0254201 A1    Aug. 15, 2019

(51) Int. Cl.
*B23P 19/00* (2006.01)
*H05K 13/04* (2006.01)
(Continued)

(52) U.S. Cl.
CPC ..... *H05K 13/0413* (2013.01); *H05K 13/0015* (2013.01); *H05K 13/02* (2013.01);
(Continued)

(58) Field of Classification Search
CPC ............. H05K 13/041; H05K 13/0408; H05K 13/0409; H05K 13/0413; H05K 13/0404;
(Continued)

(56) References Cited

U.S. PATENT DOCUMENTS

| 7,281,323 | B2 | 10/2007 | Hwang |
| 10,104,819 | B2 | 10/2018 | Nishiyama |
| 10,531,601 | B2 * | 1/2020 | Ito ..................... H05K 13/0413 |

FOREIGN PATENT DOCUMENTS

| CN | 1784141 A | 6/2006 |
| CN | 105359639 A | 2/2016 |

(Continued)

OTHER PUBLICATIONS

International Search Report dated Oct. 11, 2016 in PCT/JP2016/070676 filed Jul. 13, 2016.

*Primary Examiner* — Thiem D Phan
(74) *Attorney, Agent, or Firm* — Oblon, McClelland, Maier & Neustadt, L.L.P.

(57) ABSTRACT

A component mounter includes a mounting head configured to revolve multiple nozzle holders to which multiple pickup nozzles can detachably be attached individually in a circumferential direction and to allow the multiple pickup nozzles to rotate on their own axes while being interlocked with each other and two Z-axis drive devices provided at two locations on a revolving orbit of the multiple pickup nozzles to raise and lower the pickup nozzles situated at the two locations. Then, when a component supplied from a component supply device can be picked up at any of multiple different nozzle angles of the pickup nozzle, the component mounter moves the pickup nozzle to a revolving angle at which the pickup nozzle can be raised and lowered and then lowers the pickup nozzle to pick up the component at a nozzle angle of the multiple nozzle angles which involves a smaller moving amount.

6 Claims, 10 Drawing Sheets

(51) Int. Cl.
  *H05K 13/08* (2006.01)
  *H05K 13/00* (2006.01)
  *H05K 13/02* (2006.01)
(52) U.S. Cl.
  CPC ..... *H05K 13/0408* (2013.01); *H05K 13/0409* (2018.08); *H05K 13/0411* (2018.08); *H05K 13/081* (2018.08); *Y10T 29/53174* (2015.01)
(58) Field of Classification Search
  CPC .......... Y10T 29/53179; Y10T 29/53191; B25J 15/04; B65G 47/914
  USPC ......... 29/739, 428, 707, 743, 740, 760, 832, 29/834, 836
  See application file for complete search history.

(56) References Cited

FOREIGN PATENT DOCUMENTS

| | | |
|---|---|---|
| JP | 5-121897 A | 5/1993 |
| WO | WO 20161063328 A | 4/2016 |

\* cited by examiner (a)

(b)

(a) A,E SIMULTANEOUS PICKING UP (PICK UP ANGLE 0 Degrees)

(b) IMAGE CAPTURING (MOUNTING ANGLE 90 Degrees)

(c) A MOUNTING (MOUNTING ANGLE 90 Degrees)

(d) E MOUNTING (MOUNTING ANGLE 90 Degrees)

(a) A PICKING UP (PICKING UP ANGLE 0 Degree)

(b) E PICKING UP (PICKING UP ANGLE 0 Degree)

(c) IMAGE CAPTURING (MOUNTING ANGLE 90 Degrees)

(d) A MOUNTING (MOUNTING ANGLE 90 Degrees)

(e) E MOUNTING (MOUNTING ANGLE 90 Degrees)

COMPONENT MOUNTER

TECHNICAL FIELD

The present application relates to a component mounter.

BACKGROUND ART

Conventionally, component mounters are known in which components are picked up and are then mounted on a board. For example, Patent literature 1 discloses a component mounter including a rotary head configured not only to revolve (move around in a circular orbit) multiple pickup nozzles (pickup members) in a circumferential direction but also to cause each pickup nozzle to rotate about its own axis (rotate on its own axis), wherein a cylindrical chip member is picked up through suction to be fitted in a V-shaped groove formed on a lower surface of the pickup nozzle, and the picked up component is mounted on a printed board. In the component mounter, a chip component is picked up by the pickup nozzle which is lowered while being rotated (on its own axis) so that the direction of the V-shaped groove coincides with the axial direction of the cylindrical chip component.

PATENT LITERATURE

Patent literature 1: JP-A-05-121897

BRIEF SUMMARY

Technical Problem

There are various types of pickup nozzles (pickup members) for various types of components to be sucked (picked up), and those pickup nozzles are prepared in accordance with the shape of components to be picked up. Then, in the component mounter, when picking up a component, it is general practice to rotate the pickup nozzle so as to coincide with a reference angle (0 degree) of the component to be picked up whose angle of rotation is defined in advance. In this case, however, depending upon the angle of rotation of the pickup member before it picks up a component, an amount of rotation necessary to pick up the component becomes great, and hence, there may be a case where the mounting efficiency is deteriorated.

A main object of the present disclosure is to provide a component mounter which can pick up a component supplied by a component supply device with good efficiency.

Solution to Problem

The present disclosure adopts the following means in order to achieve the main object described above.

According to an aspect of the present disclosure, there is provided a component mounter for picking up a component supplied to a component supply position by a component supply device and mounting the component on a mounting target object, the component mounter comprising: a rotary head having a rotary body configured to hold multiple pickup members configured to pick up a component in a circumferential direction and configured not only to revolve the multiple pickup members in the circumferential direction as the rotary body rotates but also to allow the pickup members to rotate about their own axes while being interlocked with each other; a lifting and lowering device configured to raise and lower at least one pickup member of the multiple pickup members which is positioned at a predetermined revolving angle; and a control device configured to control, when a component supplied from the component supply device can be picked up at multiple different rotating angles, the head and the lifting and lowering device so that the pickup member moves to the predetermined revolving angle to be lowered and picks up the component at a rotating angle of the multiple rotating angles which involves a smaller moving amount.

The component mounter of the present disclosure includes the rotary head having the rotary body configured to hold the multiple pickup members configured to pick up a component in the circumferential direction and configured not only to revolve the multiple pickup members in the circumferential direction as the rotary body rotates but also to allow the pickup members to rotate about their own axes while being interlocked with each other and the lifting and lowering device configured to raise and lower at least one pickup member of the multiple pickup members which is positioned at the predetermined revolving angle. Then, when the component supplied from the component supply device can be picked up at the multiple different rotating angles, the component mounter controls the head and the lifting and lowering device so that the pickup member moves to the predetermined revolving angle to be lowered and picks up the component at the rotating angle of the multiple rotating angles which involves the smaller moving amount. By adopting this configuration, with the component mounter of the present disclosure, the moving amount of the pickup member for rotating on its own axis can be reduced to the smaller amount, which turns out the component being picked up efficiently, thereby making it possible to enhance the productivity of component mounted objects.

The component mounter of the present disclosure configured in the aspect described above: wherein the component supply device includes at least two component supply devices in which component supply positions as the component supply position are spaced with a predetermined pitch apart from each other; wherein the lifting and lowering device includes at least two lifting and lowering devices configured to raise and lower a first pickup member lying at a first revolving angle and a second pickup member lying at a second revolving angle which differs from the first revolving angle, both being included in the multiple pickup members, and wherein the head is configured to dispose the first pickup member and the second pickup member so as to be spaced at a distance corresponding to the predetermined pitch apart from each other. In the component mounter of this aspect, wherein the pickup members are members having a rotational symmetry of 180 degrees, wherein the first pickup member and the second pickup member are rotatable on their own axes while having a relationship where their rotating angles are 180 degrees different, and wherein the control device controls the head and the two lifting and lowering devices so that two components supplied from the two component supply devices are picked up substantially at the same time by the first pickup member and the second pickup member. By adopting these configurations, the components can be picked up more efficiently. Further, the component mounter of this aspect may include an image capturing device configured to capture an image of a component picked up by the pickup member, and the control device may determine a state of the component picked up by the pickup member based on the captured image captured by the image capturing device. In this case, since images of two components picked up substantially at the same time by the two pickup members can be captured in substantially the same orientation, the captured images can be processed easily.

In the component mounter of this form, the control device may be configured so that the control device acquires information on the shape of the pickup member to determine based on the acquired shape information whether the pickup member can pick up the component at the multiple different rotating angles of the pickup member. The shape information includes information indicating whether the shape of the pickup member is symmetrical at 0 degree and 180 degrees.

Further, in the component mounter of this form, when the component picked up by the pickup member can be mounted at the multiple different rotating angles of the pickup member, the control device controls the head and the lifting and lowering device so that the pickup member moves to the predetermined revolving angle to be lowered and picks up the component at a rotating angle of the multiple rotating angles which involves a smaller moving amount. By adopting this configuration, the component picked up by the pickup member can be mounted efficiently, thereby making it possible to enhance the productivity of component mounted objects. As this occurs, a configuration may be adopted in which the control device acquires information on the shape of the component and determines based on the acquired shape information whether the component picked up by the pickup member can be mounted at the multiple different rotating angles of the pickup member. The shape information includes information indicating whether the component has polarity.

DETAILED DESCRIPTION OF EMBODIMENT

Next, referring to drawings, a mode for carrying out the present disclosure will be described.

Figure 1:
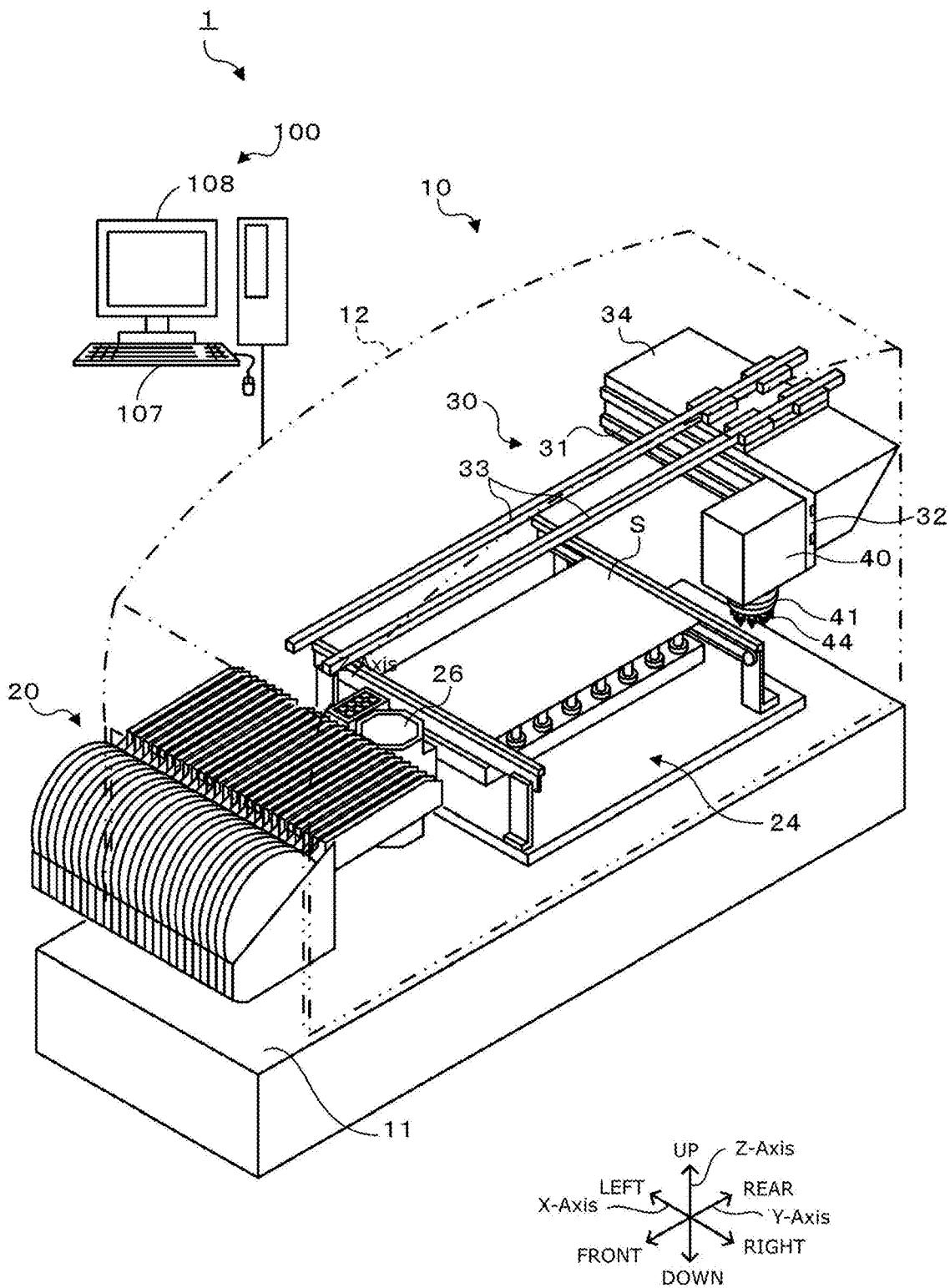
FIG. 1 is a block diagram showing a schematic configuration of component mounting system 1.
Figure 2:
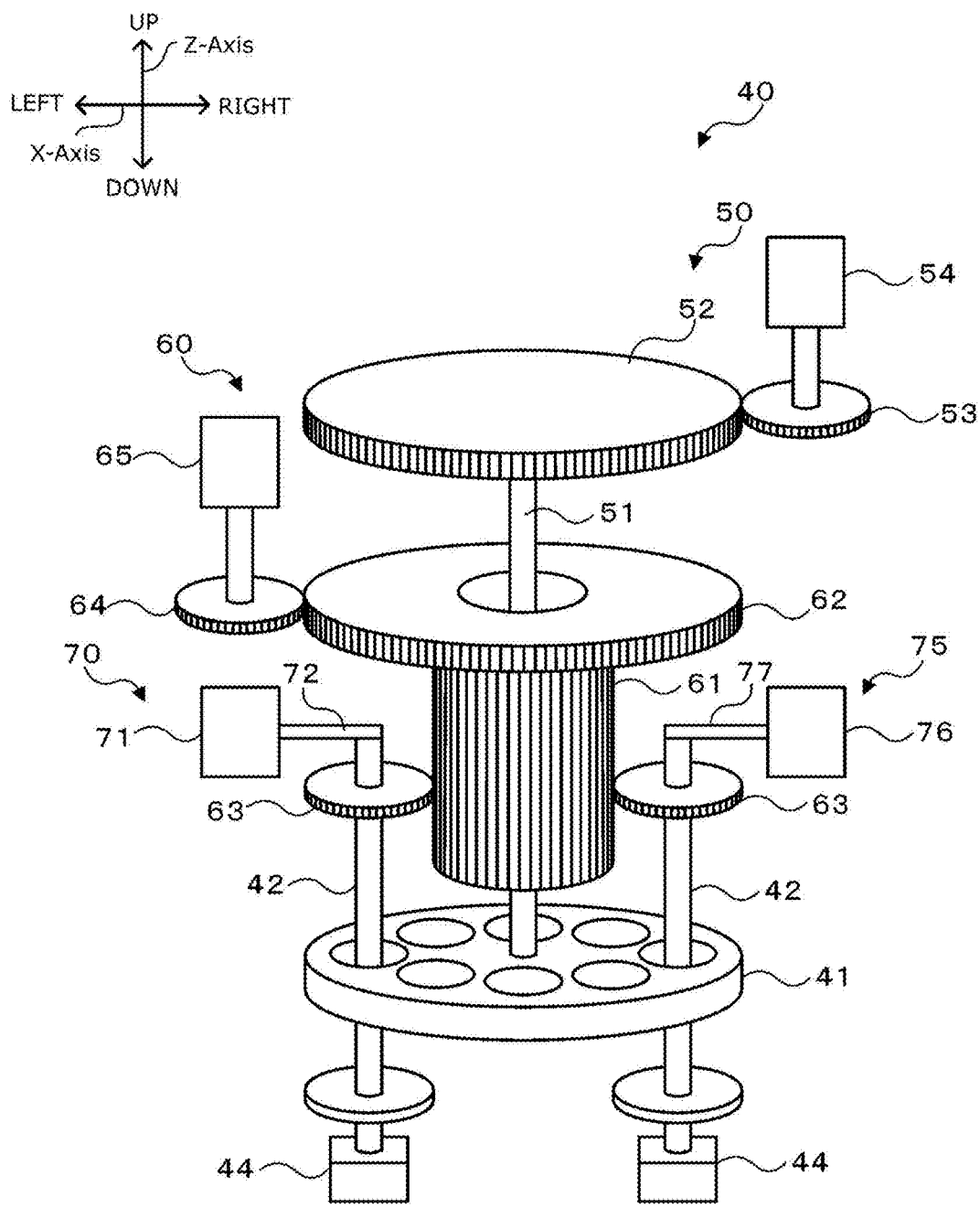
FIG. 2 is a block diagram showing a schematic configuration of mounting head 40.
Figure 3:
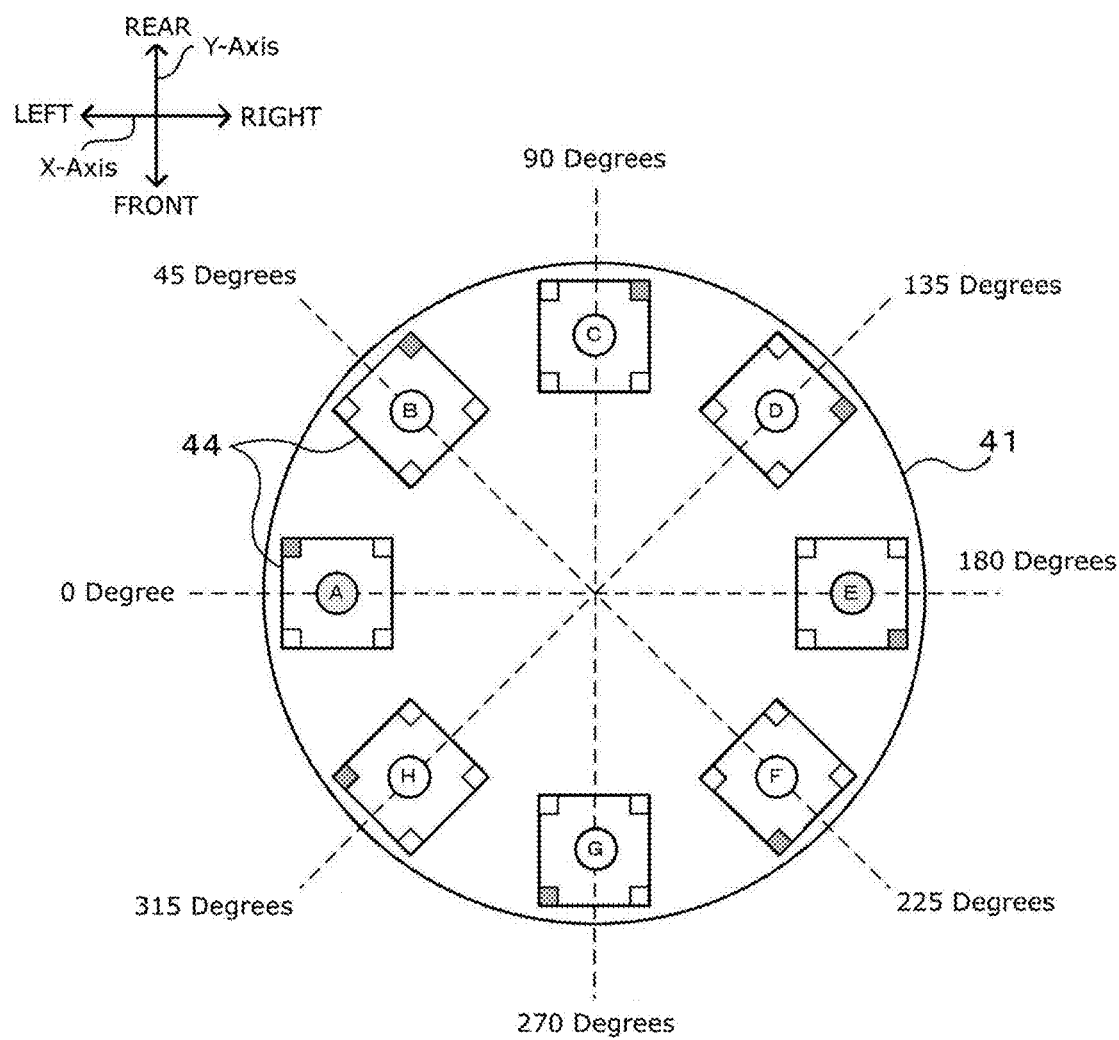
FIG. 3 is an explanatory diagram showing an arrangement of pickup nozzles 44.
Figure 4:
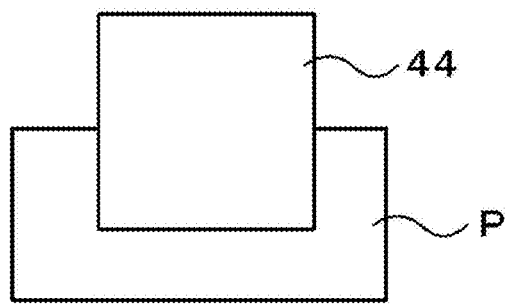
FIG. 4 shows a front view and side view of component P having symmetry and pickup nozzle 44 configured to pick up the component through suction.
Figure 4:
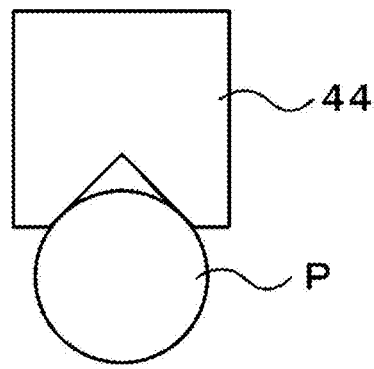
Figure 5:
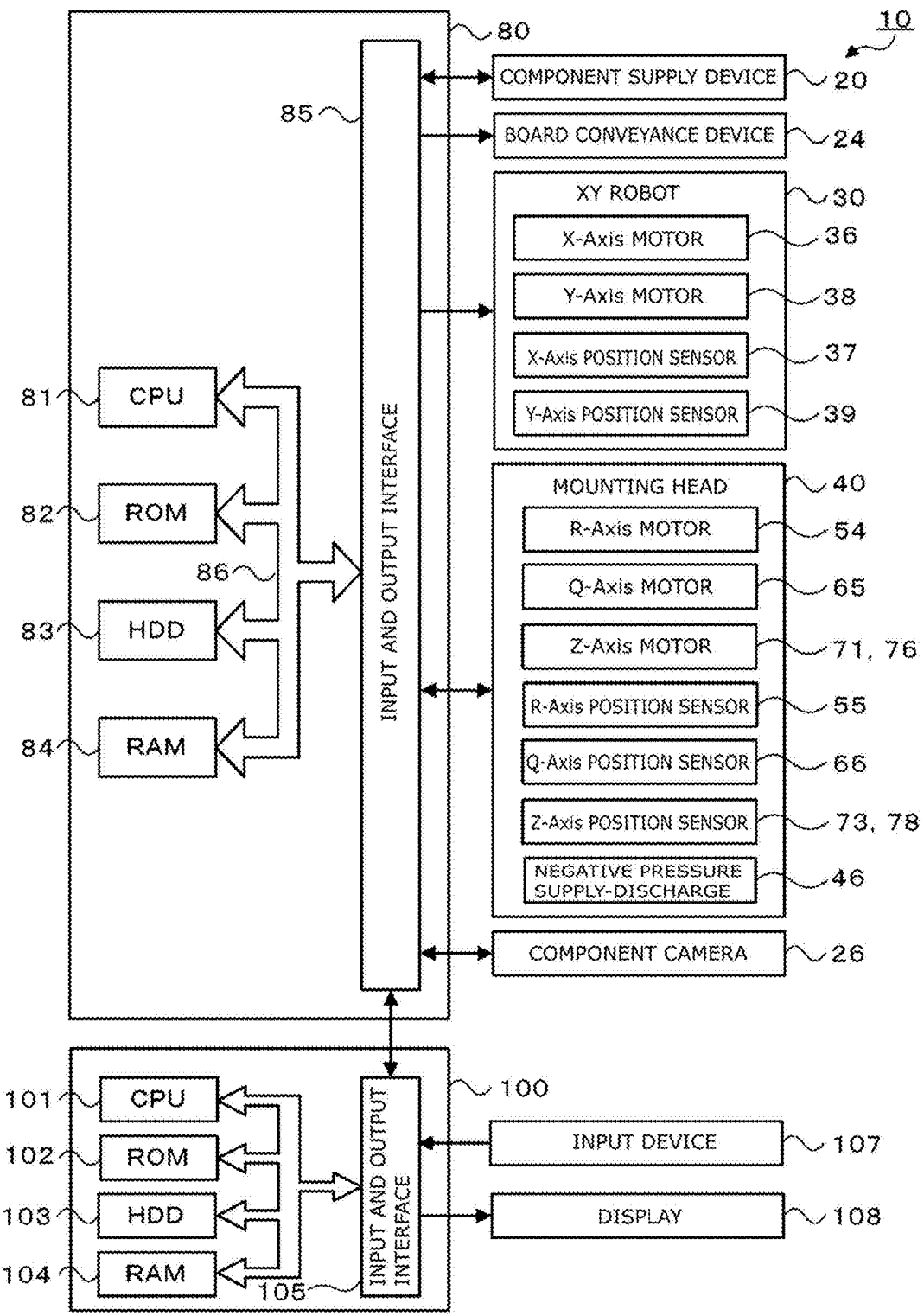
FIG. 5 is an explanatory diagram showing an electrical connection relationship between a control device 80 and a management device 100.

FIG. 1 is a block diagram showing a schematic configuration of component mounting system 1, FIG. 2 is a block diagram showing a schematic configuration of mounting head 40, FIG. 3 is an explanatory diagram showing an arrangement of pickup nozzles 44, FIG. 4 shows a front view and side view of component P having symmetry and pickup nozzle 44 configured to pick up the component through suction, and FIG. 5 is an explanatory diagram showing an electrical connection relationship between a control device 80 and a management device 100. Note that in FIG. 1, a left-and-right direction denotes an X-axis direction, a front (a near side) and rear (a far side) direction denotes a Y-axis direction, and an up-and-down direction denotes a Z-axis direction.

As shown in FIG. 1, component mounting system 1 includes multiple component mounters 10 arranged in a direction in which board S is conveyed to make up part of a component mounting line and management device 100 configured to control the whole of the component mounting system.

As shown in FIG. 1 showing an external appearance of component mounter 10, component mounter 10 is made up of a base 11 and housing 12 supported on base 11. As shown in FIG. 1, component mounter 10 includes, as constituent elements thereof, component supply device 20 configured to supply component P, board conveyance device 24 configured to convey board S, mounting head 40 configured to pick up (through suction) component P supplied to a component supply position and mount it board S, XY robot 30 configured to move mounting head 40 in the X- and Y-axis directions, and control device 80 (refer to FIG. 5) configured to control the whole of the mounter. Additionally, component mounter 10 includes a component camera 26 configured to capture a posture of component P picked up by mounting head 40 and a mark camera (not shown) provided on mounting head 40 to read a positioning reference mark applied to board S.

Component supply device 20 is configured as a tape feeder that pulls out a tape, storing components P arranged at predetermined intervals thereon, from a reel and feeds out the tape pitch by pitch so as to supply components P to a component supply position. Multiple component supply devices 20 are provided so as to be aligned in the left-and-right direction (the X-axis direction) on a front side of component mounter 10.

Board conveyance device 24 has a pair of conveyor belts that are stretched in the left-and-right direction while being spaced apart from each other in a front-and-rear direction. Board S is conveyed by the conveyor belts.

As shown in FIG. 1, XY-robot 30 includes pair of left and right Y-axis guide rails 33 that are provided along the front-and-rear direction (the Y-axis direction) at an upper portion of housing 12, Y-axis slider 34 provided on pair of left and right Y-axis guide rails 33 so as to extend thereover, X-axis guide rail 31 provided on a side surface of the Y-axis slider 34 so as to extend in the left-and-right direction (the X-axis direction), and X-axis slider 32 attached to X-axis guide rail 31. X-axis slider 32 is driven to move in the X-axis direction by X-axis motor 36 (refer to FIG. 5), and Y-axis slider 34 is driven to move in the Y-axis direction by Y-axis motor 38 (refer to FIG. 5). A position of X-axis slider 32 in the X-axis direction is detected by X-axis position sensor 37, and a position of Y-axis slider 34 in the Y-axis direction is detected by Y-axis position sensor 39. Mounting head 40 is attached to X-axis slider 32, and control device 80 drives and controls XY-robot 30 (X-axis motor 36 and Y-axis motor 38) so that mounting head 40 can move to an arbitrary position on an XY plane.

As shown in FIG. 2, mounting head 40 includes head main body 41 as a rotary body, multiple nozzle holders 42 provided at predetermined angular intervals in a circumferential direction of head main body 41 and supported so as to be raised and lowered relative to head main body 41, pickup nozzles 44 attached to distal end portions of nozzle holders 42, R-axis drive device 50 configured to revolve (move around in a circle) multiple pickup nozzles 44 about a center axis of head main body 41, Q-axis drive device 60 configured to cause pickup nozzles 44 to rotate (on their own axes) about their own center axes, and Z-axis drive devices 70, 75 provided at two locations on a revolving orbit of multiple nozzle holders 42 (multiple pickup nozzles 44) to raise and lower nozzle holders 42 lying below them in the up-and-down direction (the Z-axis direction).

R-axis drive device 50 includes R-axis 51 extending in the up-and-down direction and attached to a center axis of head main body 41 at a lower end thereof, R-axis motor 54 configured to drive to rotate gear 53 meshing with R-axis gear 52 provided at an upper end of R-axis 51, and R-axis position sensor 55 (refer to FIG. 5) configured to detect a rotational position of R-axis motor 54. R-axis drive device 50 drives to rotate R-axis 51 by way of gear 53 and R-axis gear 52 by R-axis motor 54 to revolve (move around in a circle) multiple nozzle holders 42 supported on head main body 41 together with multiple nozzles 44 in the circumferential direction.

R-axis drive device 60 includes two upper and lower Q-axis gears 61 62 that are passed on R-axis 51 concentrically so as to rotate relative to R-axis, gears 63 provided at upper portions of nozzle holders 42 and configured to mesh with lower Q-axis gear 61 slidably in the up-down direction, Q-axis drive motor 65 configured to drive and rotate gear 64 meshing with upper Q-axis gear 62, and Q-axis position sensor 66 (refer to FIG. 5) configured to detect a rotational position of Q-axis motor 65. This Q-axis drive device 60 drives to rotate Q-axis gears 61, 62 by use of Q-axis motor 65 to thereby rotate gears 63 meshing with Q-axis gear 61 and rotates nozzle holders 42 about their own axes. Since pickup nozzles 44 are attached to the distal end portions of nozzle holders 42, when nozzle holders 42 rotate (on their own axes), pickup nozzles 44 rotate (on their own axes) together with nozzle holders 42. Gears 63 provided at the upper portions of nozzle holders 42 each have the same number of gear teeth and normally mesh with Q-axis gear 61. Due to this configuration, when Q-axis gear 61 rotates, all nozzle holders 42 (pickup nozzles 44) rotate (on their own axes) the same amount in the same direction.

Z-axis drive devices 70, 75 are provided at two locations on the revolving (moving around in a circle) orbit of nozzle holders 42 and are configured to raise and lower corresponding nozzle holders 42 at the two locations. In this embodiment, Z-axis drive devices 70, 75 are provided in positions on head main body 41 which are situated at rotation angles of 0 degree and 180 degrees. Here, the position situated at 0 degree is a position situated in an opposite direction to the board conveyance direction (the X-axis direction) with respect to a center axis of head main body 41 (the position A in FIG. 3), and the position situated at 180 degrees is a position situated in the board conveyance direction with respect to the center axis of head main body 41 (the position of E in FIG. 3). As shown in FIG. 2, Z-axis drive devices 70, 75 include Z-axis sliders 72, 77, Z-axis motors 71, 76 configured to raise and lower Z-axis sliders 72, 77, respectively, and Z-axis position sensors 73, 78 (refer to FIG. 5) configured to detect raised and lowered positions of Z-axis sliders 72, 77. Z-axis drive device 70 raises and lowers nozzle holder 42 below Z-axis slider 72 together with pickup nozzle 44 by driving Z-axis motor 71 to raise and lower Z-axis slider 72. Z-axis drive device 75 raises and lowers nozzle holder 42 below Z-axis slider 77 together with pickup nozzle 44 by driving Z-axis motor 76 to raise and lower Z-axis slider 77. Z-axis motors 71, 76 may adopt linear motors to raise and lower Z-axis sliders 72, 77 or may adopt rotation motors and feed screw mechanisms to raise and lower Z-axis sliders 72, 77. In addition, actuators such as air cylinders may be used in place of Z-axis motors 71, 76 to raise and lower Z-axis sliders 72, 77.

Pickup nozzles 44 are pickup members configured to pick up (through suction) component P supplied from component supply device 20 by means of a negative pressure from a negative pressure source (not shown) where a negative pressure is supplied and discharged by way of a negative pressure supply-discharge valve 46 (refer to FIG. 5) and are attached to distal end portions of nozzle holders 42 supported on head main body 41 in an exchangeable manner. Normally, pickup nozzles 44 adopt pickup nozzles whose suction ports are of a circular shape; however, depending on shapes of components to be picked up through suction, pickup nozzles whose suction ports are of a square shape, a rectangular shape, a V-shape and the like are used, or a mechanical chuck having claws and configured to hold component P between the claws is used in place of the pickup nozzle. For example, as shown in FIG. 4, a pickup nozzle 44 having a V-shaped suction port can be used to pick up cylindrical component P such as a cylindrical resistor, a cylindrical diode, and the like. When a custom nozzle, which is different from a normal pickup nozzle having a circular suction port, is used, the direction (nozzle angle) of pickup nozzle 44 configured to pick up supplied component P is limited with respect to the direction (component angle) of component P, and it is general practice to pick up component P by aligning the direction (component angle of 0 degree) of component P with the direction (nozzle angle of 0 degree) of pickup nozzle 44. As shown in FIG. 3, mounting head 40 of this embodiment has eight pickup nozzles 44 that are arranged at intervals of equal angle (intervals of 45 degrees) for head main body 41, and pickup nozzle 44 situated in a position on head main body 41 situated at 0 degree (a position denoted by A) and pickup nozzle 44 situated in a position on head main body 41 situated at 180 degrees (a position denoted by E) can be raised and lowered by Z-axis drive devices 70, 75, respectively. Directions (Nozzle angles) of multiple (eight) pickup nozzles 44 are determined so that they are directed in a radial direction with respect to a center axis of head main body 41, and the directions (nozzle angles) of two pickup nozzles that are raised and lowered by two Z-axis drive devices 70, 75 are in a relationship where they differ at 180 degrees. In the case where custom nozzles (pickup nozzles 44) are attached to mounting head 40 configured in the way described above so that two components P supplied at the same component angle are picked up by two pickup nozzles 44, when first component P is picked up by aligning the direction (nozzle angle of 0 degree) of first component P with the direction (component angle of 0 degree) of first pickup nozzle 44, the direction (nozzle angle of 180 degrees) of second pickup nozzle 44 deviates 180 degrees relative to the direction (component angle of 0 degree) of second component P. Due to this, second pickup nozzle 44 is revolved 180 degrees or caused to rotate 180 degrees on its own axis to pick up second component P by second pickup nozzle 44.

In contrast with this, in the case where pickup nozzles 44 have such symmetry (rotational symmetry of 180 degrees) that pickup nozzles 44 can pick up component P in multiple directions (nozzle angles of 0 degree and 180 degrees), a time necessary to pick up component P can be reduced by picking up component P in a direction in which a moving distance or amount of pickup nozzle 44 becomes smaller.

For example, a case is considered where component supply device 20 supplies two components P at the same component angle to two component supply positions that are spaced with a predetermined distance apart from each other in the X-axis direction, and mounting head 40 raises and lowers two pickup nozzles 44 that are spaced a distance corresponding to the predetermined distance apart from each other. As this occurs, with pickup nozzles 44 having the rotational symmetry of 180 degrees, when a nozzle angle of first pickup nozzle 44 of two pickup nozzles 44 that can be raised and lowered is referred to as 0 degree, a nozzle angle of second pickup nozzle 44 becomes 180 degrees, and therefore, mounting head 40 can pick up two components P through suction substantially at the same time by lowering two suction nozzles 44 substantially at the same time by use of Z-axis drive devices 70, 75.

As shown in FIG. 5, control device 80 is configured as a microprocessor made up mainly of CPU 81 and includes, in addition to CPU 81, ROM 82, HDD83, ROM84, input and output interface 85, and the like. These are connected together via bus 86. Detection signals from XY-robot 30 (X-axis position sensor 37 and Y-axis position sensor 39), detection signals from mounting head 40 (R-axis position sensor 55, Q-axis position sensor 66, Z-axis position sensors 73, 78), an image signal from component camera 26, and the like are inputted into control device 80 by way of input and output interface 85. In addition, control device 80 outputs a control signal for component supply device 20, a control signal for board conveyance device 24, control signals for XY-robot 30 (X-axis motor 36 and Y-axis motor 38), control signals for mounting head 40 (R-axis motor 54, Q-axis motor 65, and Z-axis motors 71, 76), a control signal for negative pressure supply-discharge valve 46, and a control signal for component camera 26 by way of input and output interface 85.

Figure 6:
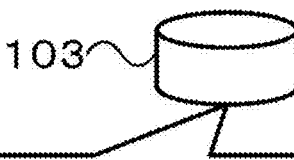
FIG. 6 is an explanatory diagram showing an example of shape information of a component and a pickup member.

Management device 100 is, for example, a general-purpose computer and is made up of CPU 101, ROM 102, HDD 103, RAM 104, input and output interface 105, and the like, as shown in FIG. 5, and input device 107 such as a keyboard, a mouse, and the like and display 108 such as an LCD are connected to management device 100. An input signal from input device 107 is inputted into management device 100 by way of input and output interface 105, and management device 100 outputs a display signal for display 108 by way of input and output interface 105. HDD 103 stores job information containing a production program for boards S and other projection information. When referred to herein, the production program denotes a program of a mounting procedure specifying components P to be picked up and mounted, boards S on which picked up components P are mounted, and orders in which picked up components P are mounted on boards S in component mounter 10, as well as the number of boards S to be produced. Additionally, the production information includes component information on mounting target components P, nozzle information (pickup member information) on pickup nozzles 44 (pickup members) to be used, mounting positions (XY coordinates) of components P on board S, mounting angles and the like. FIG. 6 is an explanatory diagram showing an example of information on shapes of a component and a pickup member stored in HDD103. As shown in the figure, the shape information includes types, sizes and polarity of components. The nozzle information includes, as shown in the figure, types of nozzles (types of pickup members) and symmetry thereof as the shape information. Here, symmetry is information denoting nozzle angles at which component P can be picked up, and "0 degree and 180 degrees" denotes that component P can be picked up at either of the nozzle angles of 0 degree and 180 degrees, whereas "No" denotes that component P can be picked up only at the nozzle angle of 0 degree. Polarity is information denoting a mountable angle at which component P can be mounted, and 'Yes" denotes that there is only one mountable angle, whereas "No" denotes that there are multiple mountable angles in a symmetrical direction. Management device 100 is connected with control device 80 so as to communicate therewith, and various types of information and control signals are transferred between them.

Figure 7:
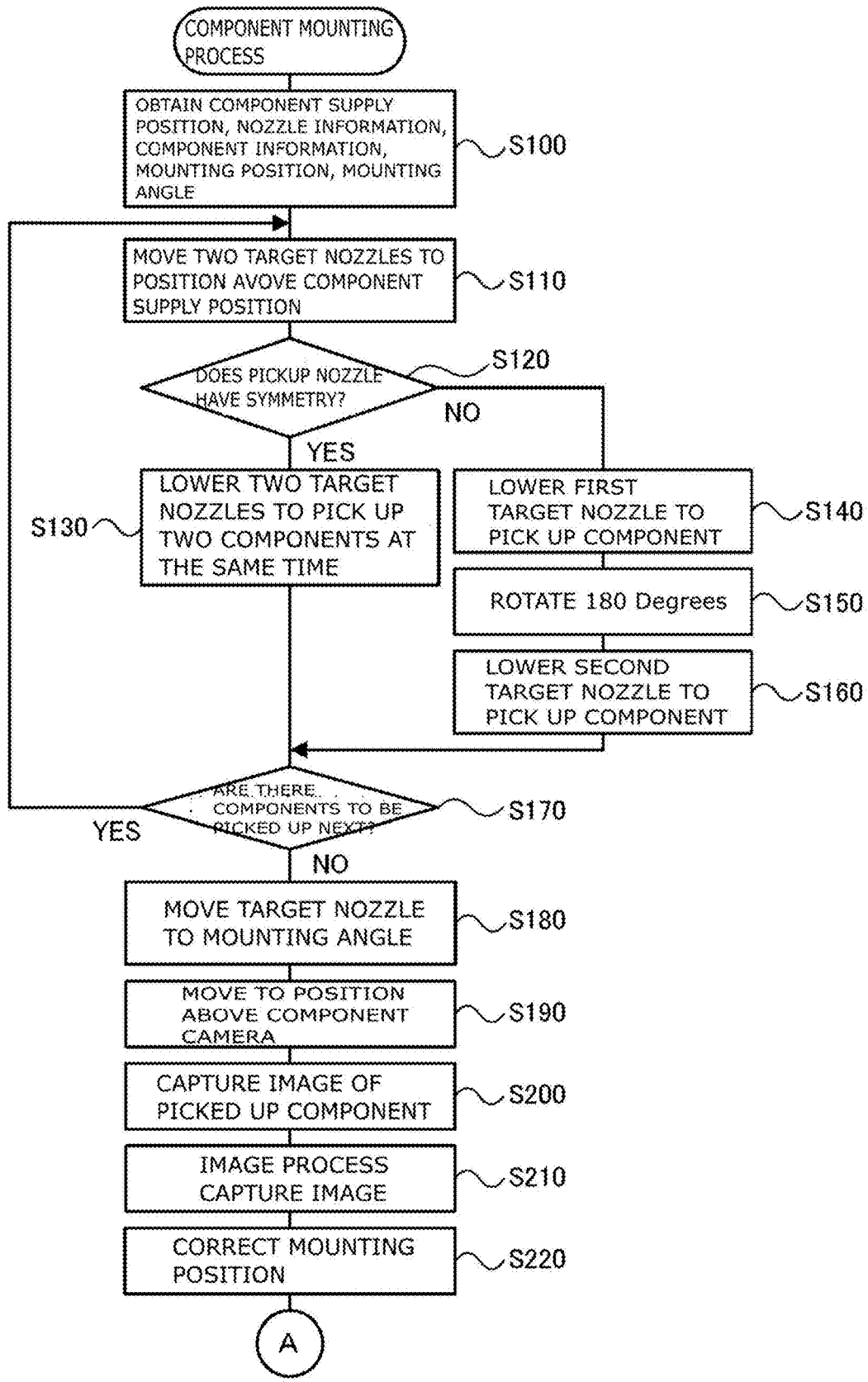
FIG. 7 is a flowchart showing an example of a component mounting process.
Figure 8:
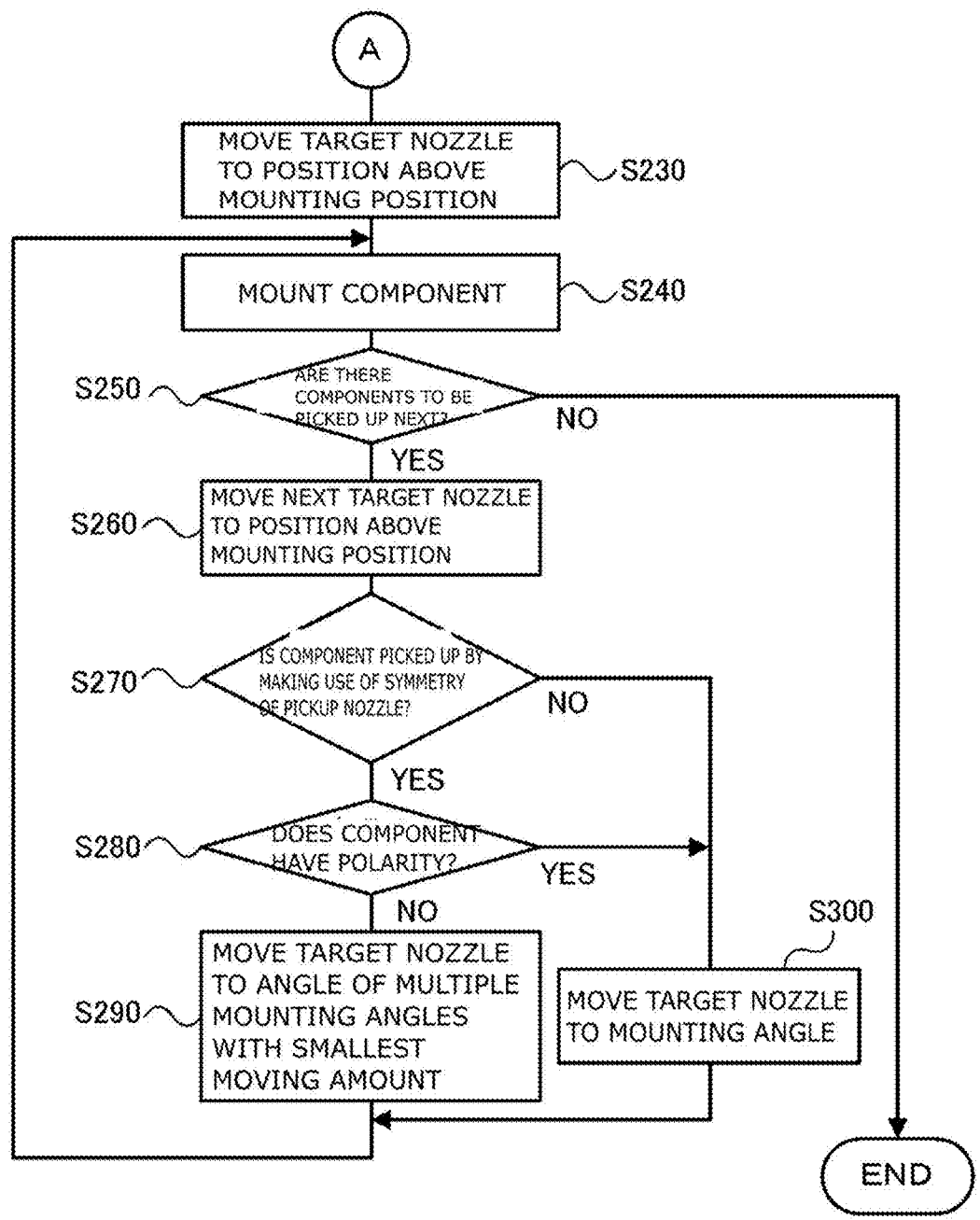
FIG. 8 is a flowchart showing an example of a component mounting process.

Next, an operation of component mounter 10 of the embodiment configured in the manner described heretofore will be described, and particularly, an operation of component mounter 10 will be described when components P are mounted on board S by use of custom nozzles. FIGS. 7 and 8 are flow charts showing an example of a component mounting process executed by CPU 81 of control device 80. This process is executed by control device 80 when it receives the job information from management device 100.

When the component mounting process is executed, CPU81 of control device 80 firstly inputs a component supply position, nozzle information, component information, a mounting position, a mounting angle, and the like from the job information received from management device 100 (Step S100). Following this, CPU 81 drives and controls XY-robot 30 (X-axis motor 36, Y-axis motor 38) and R-axis motor 54 so that two pickup nozzles 44 (target nozzles) that can be raised and lowered by Z-axis drive devices 70, 75 move to a position situated above the component supply position (Step S110). In this embodiment, it is understood that there are provided two Z-axis over which pickup nozzles 44 (nozzle holders 42) can be raised and lowered and a distance defined in the X-axis direction between two pickup nozzles 44 that can be raised and lowered coincides with a distance defined in the X-axis direction between two components P supplied from two component supply devices 20 of multiple component supply devices 20.

Next, CPU 81 determines whether pickup nozzles 44 have symmetry for target components P for pickup (pickup target components) (rotational symmetry of 180 degrees in which pickup nozzle 44 can pick up component P at both nozzle angles of 0 degree and 180 degrees) (Step S120). When determining that two target pickup nozzles 44, picking up the pickup target components, are symmetrical, CPU 81 drives and controls Z-axis drive devices 70, 75 and negative pressure supply-discharge valve 46 so that those two target nozzles are lowered substantially at the same time to pick up corresponding components P substantially at the same time (Step S130).

On the other hand, when determining that two target pickup nozzles 44, picking up pickup target components, are not symmetrical, CPU 81 drives and controls a first Z-axis drive device of Z-axis drive devices 70, 75 and negative pressure supply-discharge valve 46 so that a first target nozzle of the two target nozzles is lowered to pick up corresponding component P (Step S140), and then, CPU81 drives and controls a second Z-axis drive device of Z-axis drive devices 70, 75 and negative pressure supply-discharge valve 46 so that a second target nozzle of the two target nozzles is lowered to pick up corresponding component P (Step S160), while controlling to drive Q-axis motor 65 so that a second target nozzle rotates 180 degrees (on its own axis) (Step S 150).

When the target nozzles have picked up corresponding components P, CPU 81 determines whether there are components P to be picked up next (Step S170), and when determining that there are components P to be picked up next, CPU 81 returns to Step S110 where CPU 81 moves next two target nozzles to the component supply position and then repeats the processes in Steps S120 to S160.

When determining that there are no components P to be picked up next, CPU 81 drives and controls Q-axis motor 65 so that the target nozzles move to the mounting angles (Step S180) and then drives and controls XY-robot 30 so that the components P picked up by the pickup nozzles 44 of mounting head 40 are moved to a position situated above component camera 26 (Step S190). Then, CPU81 controls component camera 26 to captures images of components P picked up by pickup nozzles 44 of mounting head 40 (Step S200), image processes the captured images so obtained (Step S210), and corrects the mounting position inputted in Step S100 (Step S220).

When correcting the mounting position, CPU81 drives and controls XY robot 30 so that the target nozzle moves above the mounting position (Step S230), and drives and controls the corresponding Z-axis drive device so that component P picked up by the target nozzle is mounted on the mounting position on board S (Step S240).

Then, CPU81 determines whether there is component P to be mounted next (step S 250), and when determining that there is component P to be mounted next, CPU 81 moves the next target nozzle to a position above a mounting position (Step S260).

Next, CPU81 determines whether component P picked up by the target pickup is picked up by making use of the symmetry of pickup nozzle 44 (Step S270), and whether component P has polarity (Step S280). The determination in Step S280 can be performed based on the component information inputted in Step S100. When determining that the picked up component is picked by making use of the symmetry of pickup nozzle 44 and that the picked up component has no polarity, CPU 81 repeats the process of mounting component P in the mounting position on board S (Step S240), while controlling and driving Q-axis motor 65 so that the target nozzle is moved to a mounting angle of the multiple mounting angles inputted in Step S100 which involves a small moving amount (Step S290). On the other hand, when determining in Step S270, S280 that component P picked up by the target nozzle is not picked up by making use of the symmetry of pickup nozzle 44 and that component P picked up by the target nozzle has polarity, CPU 81 repeats the process of mounting component P in the mounting position on board S (Step S240), while controlling and driving Q-axis motor 65 so that the target nozzle is moved to one mounting angle inputted in Step S100 (Step S300)

When determining in Step S250 that there is no component P to be mounted next, CPU 81 ends the component mounting process.

Figure 9:
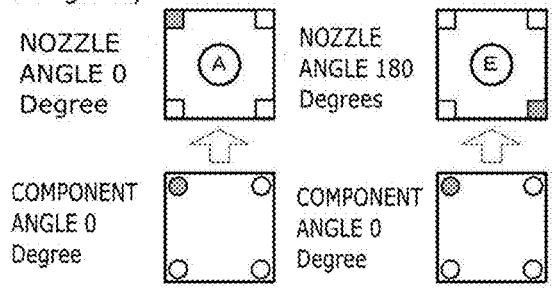
FIGS. 9(a) to 9(d) show explanatory diagrams showing pickup and mounting operations of an embodiment of the present disclosure.
Figure 9:
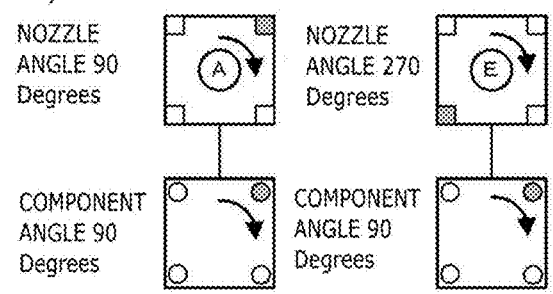
Figure 9:
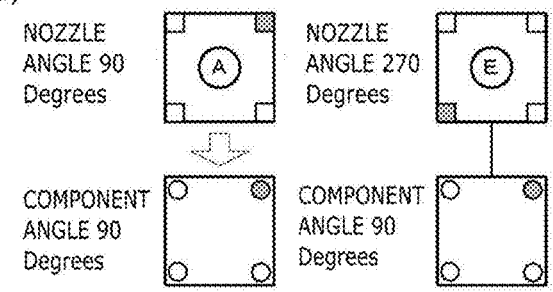
Figure 9:
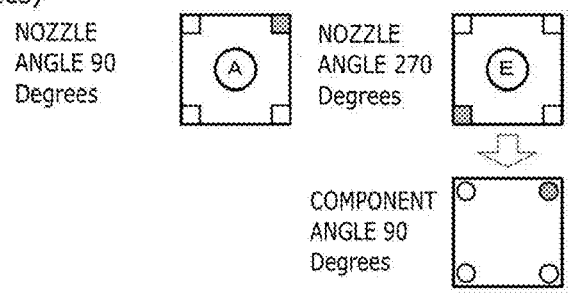
Figure 10:
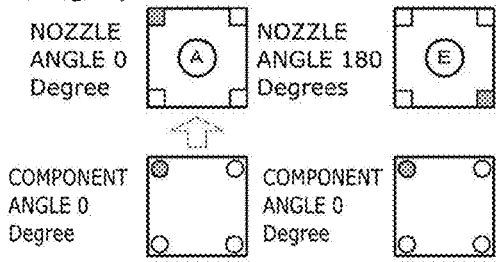
FIGS. 10(a) to 10(e) show explanatory diagrams showing pickup and mounting operations of a comparison example.
Figure 10:
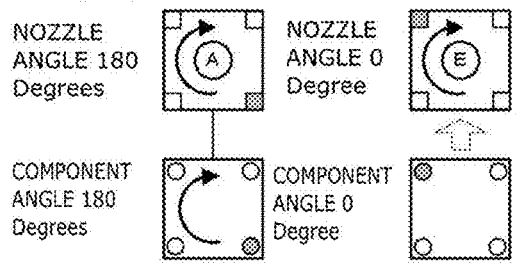
Figure 10:
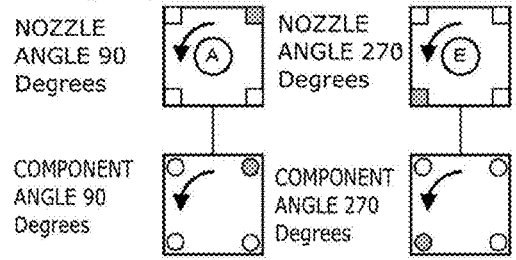
Figure 10:
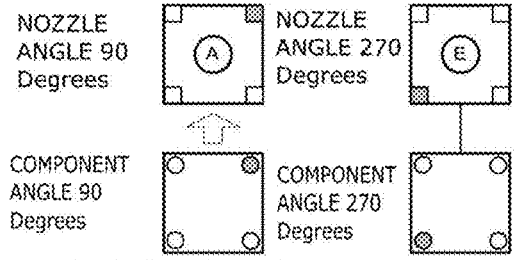
Figure 10:
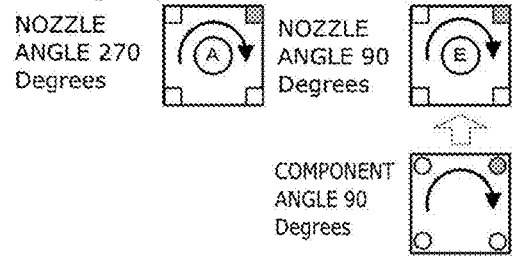

FIGS. 9(*a*) to 9(*d*) show explanatory diagrams showing picking up and mounting operations of this embodiment, and FIGS. 10(*a*) to 10(*e*) shows explanatory diagrams showing picking up and mounting operations of a comparison example. A case is considered where component supply device 20 supplies two components P, being provided at a predetermined interval in the left-and-right direction (the X-axis direction) at a component angle of 0 degree, which can be picked up by pickup nozzle 44 with being situated at any of nozzle angle 0 degree and nozzle angle 180 degrees, and mounting head 40 picks up these components P by use of two target nozzles A, E to mount them in mounting positions on board S at a mounting angle of 90 degrees. In this embodiment, two target nozzles A, E that pick up two components P have a relationship where their nozzle angles are 180 degrees different, and therefore, when the nozzle angle of first target nozzle A is 0 degree, the nozzle angle of second target nozzle E becomes 180 degrees. Since two components P, being supplied at the component angle of 0 degree, have the rotational symmetry of 180 degrees where two components P can be picked up by any of pickup nozzle A and pickup nozzle E with being situated at the respective nozzle angles of 0 degree and 180 degrees, two components P can be picked up at the same time by two target nozzles A, E by lowering two target nozzles A, E at the same time (refer to FIG. 9(*a*)). As this occurs, the component angles of two components P are both 0 degree. Next, when rotating first target nozzle A so that the component angle (0 degree) of component P picked up by first target nozzle A coincides with the mounting angle (90 degrees), the component angle of component P picked up by second target nozzle also becomes a component angle that is the same as the mounting angle (refer to FIG. 9(*b*)). This allows component camera 26 to capture images of two components P in this state, whereby the images of two components P which are situated at the same component angle (mount angle) can be captured. Consequently, when processing the images by recognizing the components from the captured images, a process of rotating the component images can be omitted, thereby making it possible to perform the image processing efficiently. Then, after mounting component P picked up by first target nozzle A at the mounting angle (90 degrees) (refer to FIG. 9(*c*)), component P picked by second target nozzle E is mounted at the same mounting angle (90 degrees) without having to rotate component P (refer to FIG. 9(*d*)).

In contrast with this, in the comparison example, component P supplied at a component angle of 0 degree is always picked up at a nozzle angle of 0 degree. In this case, the nozzle angle of first target nozzle A is set at 0 degree, and only first target nozzle A is lowered (refer to FIG. 10(*a*)). As this occurs, the nozzle angle of second target nozzle E is 180 degrees. After causing first target nozzle A to pick up component P, first target nozzle A is raised and second target nozzle E is revolved 180 degrees or caused to rotate 10 degrees on its own axis to set the nozzle angle of second target nozzle E at 0 degree, and only second target nozzle E is lowered to pick up component P (refer to FIG. 10(*b*)). As this occurs, the nozzle angle of first target nozzle A and the component angle of component P both become 180 degrees. Next, when rotating first target nozzle A so that the component angle (0 degree) of component P picked up by first target nozzle A coincides with the mounting angle (90 degrees), the component angle of component P picked up by second target nozzle E become an angle (270 degrees) that is 180 degrees different from the mounting angle (refer to FIG. 10(*c*)). Due to this, when component camera 26 is cause to capture images of two components P in this state, the images of two components P are oriented in directions that are 180 degrees different, and therefore, the images need to be rotated for image processing. Then, after mounting component P picked up by first target nozzle A at the mounting angle (90 degrees) (refer to FIG. 10(*d*)), component P picked up by second target nozzle E is revolved 180 degrees or caused to rotate 180 degrees on its own axis so that the component angle of component P coincides with the mounting angle (90 degrees), where after component P is mounted on board S (refer to FIG. 10(*e*)). In this way, in the comparison example, the operation of rotating target nozzle E 180 degrees is needed in the operations of picking up and mounting component P, whereby the mounting efficiency (productivity) is reduced.

Here, the correlation between the constituent elements of this embodiment and the constituent elements of the present disclosure is clarified. Component supply device 20 of this embodiment corresponds to the "component supply device" of the present disclosure, pickup nozzle 44 to the "pickup member," head main body 41 to the "rotary body," mounting head 40 to the "head," Z-axis drive devices 70, 75 to the "lifting and lowering device," and control device 80 to the "control device." In addition, component camera 26 corresponds to the "image capturing device."

Component mounter 10 of this embodiment that has been described heretofore includes the mounting head 40 configured not only to revolve multiple nozzle holders 42 to which multiple pickup nozzles 44 can detachably be attached individually in the circumferential direction but also to allow pickup nozzles 44 to rotate on their own axes while being interlocked with each other, and Z-axis drive devices 70, 75 that are provided at the two locations on the revolving orbit of multiple pickup nozzles 44 to raise and lower pickup nozzles 44 situated at the two locations. Then, when a component supplied from component supply device 20 can be picked up at multiple different nozzle angles of pickup nozzle 44, the component mounter 10 moves pickup nozzle 44 to the revolving angle at which pickup nozzle 44 can be raised and lowered and then lowers pickup nozzle 44 to pick up component P at the nozzle angle of the multiple nozzle angles which involves a smaller moving amount. By adopting this configuration, the component mounter 10 can enhance the productivity of component mounted boards by reducing the time necessary to pick up components P.

In addition, component mounter 10 of this embodiment picks up two components P supplied at intervals corresponding to the predetermined interval from component supply device 20 substantially at the same time by two pickup nozzles 44 that are raised and lowered at the predetermined interval and at the nozzle angles that are 180 degrees different by Z-axis drive devices 70, 75 (Z axis) of mounting head 40. By adopting this configuration, since the time necessary to pick up components P can be reduced further, component mounter 10 can enhance further the productivity of component mounted boards.

Further, when the component picked up by pickup nozzle 44 has no polarity and can be picked up at any of the multiple mounting angles, component mounter 10 mounts component P on board S by causing the nozzle angle of pickup nozzles 44 to coincide with the mounting angle of the multiple mounting angles that involves the smaller moving amount. By adopting this configuration, component mounter 10 can enhance further the productivity of component mounted boards by enhancing the mounting efficiency of boards S.

The present disclosure is not limited at all to the embodiment that has been described above, and hence, needless to say, the present disclosure can be carried out in various ways without departing from the technical scope of the present disclosure.

For example, in the embodiment described above, while the pickup nozzle configured to pick up component P through a negative pressure is used as the pickup member, the present disclosure is not limited to this, and hence, for example, a mechanical chuck may be used which is configured to hold component P between claws thereof.

In the embodiment, mounting head 40 is described as including Z-axis drive devices 70, 75 at the two locations on the revolving orbit of nozzle holders 42. However, mounting head 40 may have one or three or more Z-axis drive devices.

In the embodiment described above, while component mounter 10 acquires the nozzle angles at which component P can be picked up by making use of the shape information indicating the symmetry of pickup nozzle 44, component mounter 10 may determine based on the shape of the pickup member whether component P can be picked up at multiple nozzle angles.

In the embodiment described above, when component P have no polarity, and there exist multiple mounting angles at which component P is mounted on board S, component mounter 10 is described as mounting component P on board S by causing the nozzle angle of pickup nozzle 44 to coincide with the mounting angle of the multiple mounting angles that involves the smaller moving amount. However, regardless of whether component P has polarity, component mounter 10 may mount component P on board S by using one mounting angle and causing the nozzle angle of pickup nozzle 44 to coincide with the mounting angle.

INDUSTRIAL APPLICABILITY

The present disclosure can be applied to the manufacturing industry of component mounters.

REFERENCE SIGNS LIST

1 Mounting system; 10 Component mounter; 11 Base; 12 Housing; 20 Component supply device; 24 Board conveyance device; 26 Component camera; 30 XY-robot; 31 Guide rail; 32 X-axis slider; 33 Guide rail; 34 Y-axis slider; 36 X-axis motor; 37 X-axis position sensor; 38 Y-axis motor; 39 Y-axis position sensor; 40 Mounting head; 41 Head main body; 42 Nozzle holder; 44 pickup nozzle; 46 Negative pressure supply-discharge valve; 50 R-axis drive device; 51 R-axis; 52 R-axis gear; 53 gear; 54 R-axis motor; 55 R-axis position sensor; 60 Q-axis drive device; 61, 62 Q-axis gear; 63, 64 Gear; 65 Q-axis motor; 66 Q-axis position sensor; 70, 75 Z-axis drive device; 71, 76 Z-axis motor; 72, 77 Z-axis slider; 73, 78 Z-axis position sensor; 80 Control device; 81 CPU; 82 ROM; 83 HDD; 84 RAM; 85 Input and output interface; 86 Bus; 100 Management device; 101 CPU; 102 ROM; 103 HDD; 104 RAM; 105 Input and output interface; 107 Input device; 108 Display; P component; S board.

The invention claimed is:

1. A component mounter for picking up a component supplied to a component supply position by a component supply device and mounting the component on a mounting target object, the component mounter comprising:
 a rotary head having a rotary body configured to hold multiple pickup members configured to pick up the component in a circumferential direction and configured to revolve the multiple pickup members in the circumferential direction as the rotary body rotates and to allow the pickup members to rotate about their own axes while being interlocked with each other;
 a lifting and lowering device configured to raise and lower at least one pickup member of the multiple pickup members which is positioned at a predetermined revolving angle;
 a storage memory that stores component shape information and pickup member information, the component shape information including polarity information which denotes a number of mountable angles of the component, and
 a control device configured to acquire from the storage memory the polarity information of the component, control, when the polarity information of the component includes multiple different mountable angles, the head and the lifting and lowering device so that the pickup member moves to the predetermined revolving angle to be lowered and picks up the component at a rotating angle of the multiple mountable angles which is a smallest rotation from a current angle of the pickup member.

2. The component mounting machine according to claim 1, wherein the component supply device includes at least two component supply devices in which component supply positions as the component supply position are spaced with a predetermined pitch apart from each other;

wherein the lifting and lowering device includes at least two lifting and lowering devices configured to raise and lower a first pickup member lying at a first revolving angle and a second pickup member lying at a second revolving angle which differs from the first revolving angle, both being included in the multiple pickup members, and wherein the head is configured to dispose the first pickup member and the second pickup member so as to be spaced at a distance corresponding to the predetermined pitch apart from each other.

3. The component mounter according to claim 2, wherein the pickup members are members having a rotational symmetry of 180 degrees, wherein the first pickup member and the second pickup member are rotatable on their own axes while having a relationship where their rotating angles are 180 degrees different, and wherein the control device controls the head and the two lifting and lowering devices so that two components supplied from the two component supply devices are picked up substantially at the same time by the first pickup member and the second pickup member.

4. The component mounter according to claim 3, comprising:

an image capturing device configured to capture an image of a component picked up by the pickup member, wherein the control device determines a state of the component picked up by the pickup member based on the captured image captured by the image capturing device.

5. The component mounter according to claim 1, wherein the control device acquires from the storage memory the pickup member information which includes shape information on a shape of the pickup member to determine based on the acquired shape information whether the pickup member can pick up the component at multiple different rotating angles of the pickup member.

6. The component mounting machine according to claim 1, wherein the control device is configured to acquire from the storage memory the pickup member information of the pick up member, and control, when the pickup member information includes symmetry information in which the component can be picked up by the pickup member at multiple different rotating angles of the pickup member, the head and the lifting and lowering device so that the pickup member moves to the predetermined revolving angle to be lowered and picks up the component at a rotating angle of the multiple rotating angles which is a smallest rotation from the current angle of the pickup member.

* * * * *